United States Patent
Kurth et al.

(10) Patent No.: US 7,218,547 B2
(45) Date of Patent: *May 15, 2007

(54) ROM EMBEDDED DRAM WITH ANTI-FUSE PROGRAMMING

(75) Inventors: Casey Kurth, Eagle, ID (US); Scott Derner, Meridian, ID (US); Phillip G. Wald, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 39 days.

This patent is subject to a terminal disclaimer.

(21) Appl. No.: 10/843,161

(22) Filed: May 11, 2004

(65) Prior Publication Data

US 2004/0208050 A1 Oct. 21, 2004

Related U.S. Application Data

(63) Continuation of application No. 10/190,631, filed on Jul. 8, 2002, now Pat. No. 6,735,108.

(51) Int. Cl.
*G11C 11/24* (2006.01)

(52) U.S. Cl. .................... 365/149; 365/225.7; 365/102

(58) Field of Classification Search ................ 365/149, 365/225.7, 102, 185.08, 94, 63
See application file for complete search history.

(56) References Cited

U.S. PATENT DOCUMENTS

| | | | |
|---|---|---|---|
| 5,148,391 A | 9/1992 | Zagar | |
| 5,241,496 A | 8/1993 | Lowrey et al. | |
| 5,672,994 A * | 9/1997 | Au et al. | 327/525 |
| 5,995,409 A * | 11/1999 | Holland | 365/149 |
| 6,134,137 A | 10/2000 | Kurth et al. | |
| 6,154,864 A | 11/2000 | Merritt | |
| 6,327,174 B1 * | 12/2001 | Jung et al. | 365/149 |
| 6,643,159 B2 * | 11/2003 | Fricke et al. | 365/51 |

* cited by examiner

*Primary Examiner*—David Lam
(74) *Attorney, Agent, or Firm*—Leffert Jay & Polglaze, P.A.

(57) ABSTRACT

A ROM embedded DRAM provides ROM cells that can be electrically programmed to a data state using DRAM capacitor memory cells. Numerous techniques for reading the memory cells are provided if a single state memory is desired. For example, bias techniques allow un-programmed ROM cells to be read accurately. In one embodiment, the memory includes program circuitry to short capacitor plates together by breaking down an intermediate dielectric layer using anti-fuse programming techniques.

25 Claims, 8 Drawing Sheets

ROM EMBEDDED DRAM WITH ANTI-FUSE PROGRAMMING

RELATED APPLICATION

This Application is a Continuation of U.S. application Ser. No. 10/190,631 filed Jul. 8, 2002 now U.S. Pat. No. 6,735,108, which is incorporated herein by reference.

TECHNICAL FIELD OF THE INVENTION

The present invention relates generally to memory devices and in particular the present invention relates to read only memory (ROM) embedded in a dynamic random access memory (DRAM).

BACKGROUND OF THE INVENTION

Semiconductor memory systems are comprised of two basic elements: memory storage areas and memory control areas. DRAM, for example, includes a memory cell array, which stores information, and peripheral circuitry, which controls the operation of the memory cell array.

DRAM arrays are manufactured by replicating millions of identical circuit elements, known as DRAM cells, on a single semiconductor wafer. A DRAM cell is an addressable location that can store one bit (binary digit) of data. In its most common form, a DRAM cell consists of two circuit components: a storage capacitor and an access field effect transistor. The capacitor holds the value of each cell, namely a "1" or a "0," as a charge on the capacitor. Because the charge on a capacitor gradually leaks away, DRAM capacitors must be refreshed on a regular basis. A memory device incorporating a DRAM memory includes logic to refresh (recharge) the capacitors of the cells periodically or the information will be lost. Reading the stored data in a cell and then writing the data back into the cell at a predefined voltage level refreshes a cell. The required refreshing operation is what makes DRAM memory dynamic rather than static.

The transistor of a DRAM cell is a switch to let control circuitry for the RAM either read the capacitor value or to change its state. The transistor is controlled by a row line coupled to its gate connection. In a read operation, the transistor is activated and sense amplifiers coupled to bit lines (column) determine the level of charge stored in the memory cell capacitor, and reads the charge out as either a "1" or a "0" depending upon the level of charge in the capacitor. In a write operation, the sense amplifier is overpowered and the memory cell capacitor is charged to an appropriate level.

Frequently, as in the case of microprocessors, microcontrollers, and other application specific integrated circuitry (ASICs), it is desired to incorporate read only memory (ROM) together with or in addition to RAM on a single semiconductor wafer. This typically requires the formation of separate additional peripheral circuitry and interconnects for the ROM. The ROM cells and additional circuitry require additional semiconductor wafer space and fabrication process steps that increase the overall costs of device fabrication.

A read only memory (ROM) consists of an array of semiconductor devices (diodes, bipolar or field-effect transistors), which interconnect to store an array of binary data (ones or zeros). A ROM basically consists of a memory array of programmed data and a decoder to select the data located at a desired address in the memory array.

Three basic types of ROMs are mask-programmable ROMs, erasable programmable ROMs (EPROMs) and field-programmable ROMs (PROMs). The data array is permanently stored in a mask-programmable ROM, at the time of manufacture, by selectively including or omitting the switching elements at the row-column intersections in the memory array. This requires a special mask used during fabrication of the integrated circuit, which is expensive and feasible only when a large quantity of the same data array is required. EPROMs use a special charge-storage mechanism to enable or disable the switching elements in the memory array. In this case, appropriate voltage pulses to store electrical charges at the memory array locations are provided. The data stored in this manner is generally permanent until it is erased using ultraviolet light allowing it to once again be programmed. PROMs are typically manufactured with all switching elements present in the array, with the connection at each row-column intersection being made by means of either a fuse element or an anti-fuse element. In order to store data in the PROM, these elements (either the fuse or the anti-fuse, whichever are used in the design) are selectively programmed using appropriate voltage pulses supplied by a PROM programmer. Once the elements are programmed, the data is permanently stored in the memory array.

Programmable links have been used extensively in programmable read only memory (PROM) devices. Probably the most common form of programmable link is a fusible link. When a user receives a PROM device from a manufacturer, it usually consists of an X-Y matrix or lattice of conductors or semiconductors. At each cross-over point of the lattice a conducting link, call a fusible link, connects a transistor or other electronic node to this lattice network. The PROM is programmed by blowing the fusible links to selected nodes and creating an open circuit. The combination of blown and unblown links represents a digital bit pattern of ones and zeros signifying data that the user wishes to store in the PROM. By providing an address the data stored on a node may be retrieved during a read operation.

In recent years, a second type of programmable link, call an anti-fuse link, has been developed for use in integrated circuit applications. Instead of the programming mechanism causing an open circuit as in the case with fusible links, the programming mechanism in an anti-fuse circuit creates a short circuit or relatively low resistance link. Thus the anti-fuse link presents an open circuit prior to programming and a low resistance connection after programming. Anti-fuse links consist of two electrodes comprised of conductive and/or semiconductive materials and having some kind of a dielectric or insulating material between them. During programming, the dielectric in between the conductive materials is broken down by predetermined applied voltages, thereby electrically connecting the conducting and/or semiconducting materials together.

Anti-fuses typically comprise a dielectric layer, such as an oxide or nitride, formed between two conductive plates. The anti-fuse presents a high impedance between the conductive plates before being "blown" or programmed, and a relatively low impedance between the conductive plates after being programmed. To program the anti-fuse, a programming voltage of a sufficient magnitude is applied across the conductive plates causing a "breakdown" of the dielectric layer, which results in the dielectric layer having relatively low impedance. Anti-fuses are used in a variety of applications, including selectively enabling or disabling components on a semiconductor integrated circuit. For example, in a dynamic random access memory anti-fuses are used to enable redundant rows of memory cells, which are used to replace defective rows of memory cells and thereby allow an otherwise defective memory to be utilized.

For the reasons stated above, and for other reasons stated below which will become apparent to those skilled in the art upon reading and understanding the present specification, there is a need in the art for a ROM-embedded-DRAM in which the ROM cells can be electrically programmed.

SUMMARY OF THE INVENTION

The above-mentioned problems with ROM-embedded-DRAM and other problems are addressed by the present invention and will be understood by reading and studying the following specification.

In one embodiment, a memory device comprises an array of capacitor memory cells, access transistors coupled between each capacitor memory cell and a digit line, sense amplifier circuitry coupled to the digit line, and program circuitry coupled to selectively program the capacitor memory cells, such that conductive plates of the capacitor memory cells are permanently shorted together.

In another embodiment, a read only memory (ROM) embedded dynamic random access memory (DRAM) comprises a first DRAM memory cell array, a second DRAM memory cell array, and program circuitry coupled to selectively program the second DRAM memory cell array, such that conductive plates of a plurality of memory cells of the second DRAM array are permanently shorted together.

A method of programming a read only memory (ROM) comprises providing a program potential, and selectively electrically shorting first memory cell capacitors using the program potential, such that the first memory cell capacitors form a non-volatile conductive path.

In another embodiment, a method of providing a read only memory (ROM) embedded dynamic random access memory (DRAM) comprises fabricating a ROM array comprising memory capacitor cells, and applying a program voltage to a first plurality of the memory capacitor cells to break down a dielectric layer to selectively short the first plurality of the memory capacitor cells. The method includes coupling the first plurality of the memory cells to a first voltage, and charging a second plurality of the memory capacitor cells to a second voltage.

DETAILED DESCRIPTION OF THE INVENTION

Figure 1:
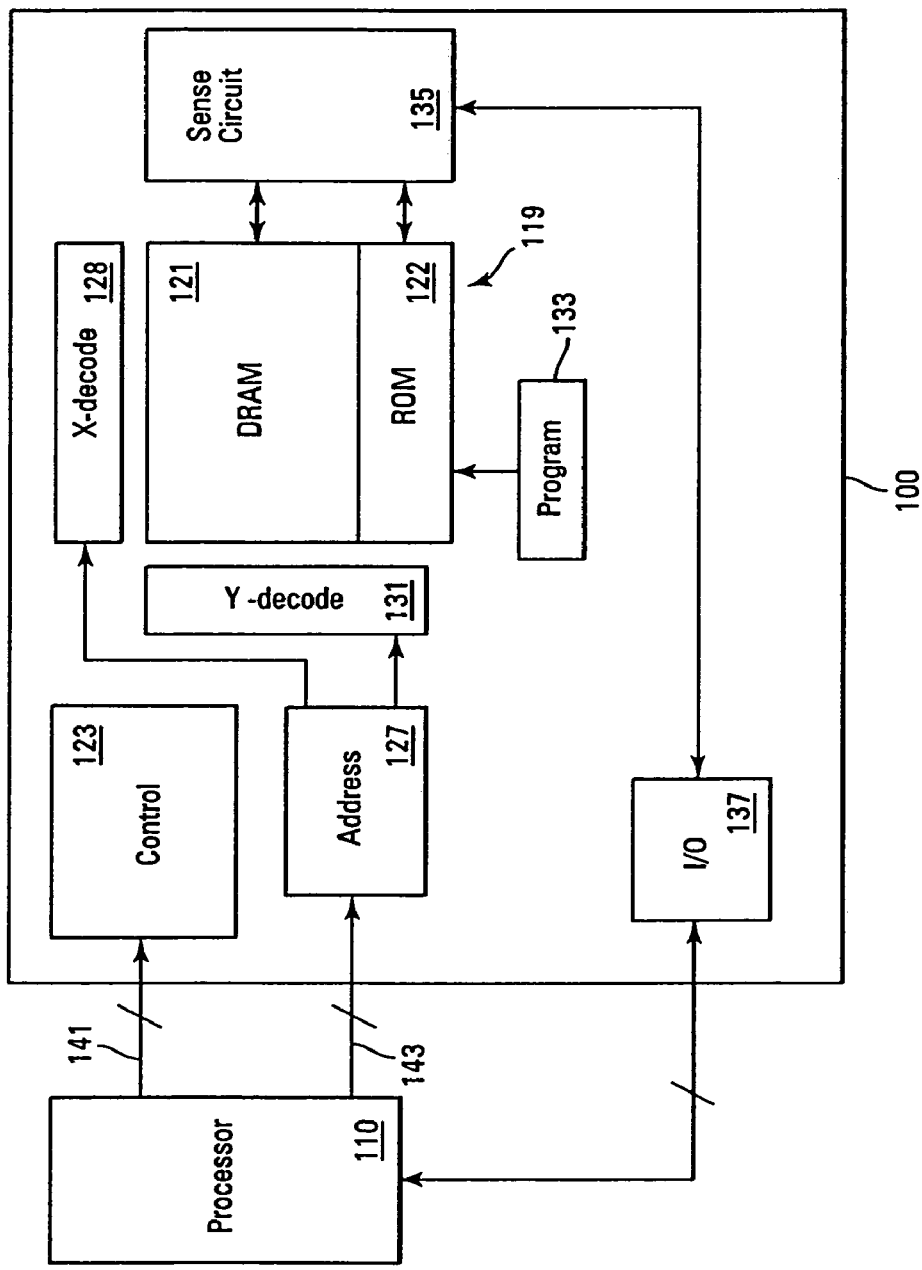
FIG. 1 is a simplified block diagram of a ROM embedded DRAM of an embodiment of the present invention.

Referring to FIG. 1, a simplified block diagram of a ROM embedded DRAM 100 of the present invention is described. The memory device can be coupled to a processor 110 for bi-directional data communication. The memory includes an array of memory cells 119. The array includes a dynamic (DRAM) portion 121 and a read only (ROM) portion 122. The ROM array is "embedded" in the dynamic memory and may include some dynamic cells. Control circuitry 123 is provided to manage data storage and retrieval from the array in response to control signals 141 from the processor. Address circuitry 127, X-decoder 128 and Y-decoder 131 analyze address signals 143 and storage access locations of the array. Sense circuitry 135 is used to read data from the array and couple output data to I/O circuitry 137. The I/O circuitry operates in a bi-directional manner to receive data from processor 110 and pass this data to array 119. It is noted that the sense circuitry may not be used in some embodiments to store the input data.

Dynamic memories are well known, and those skilled in the art will appreciate the that the above-described ROM embedded DRAM has been simplified to provide a basic understanding of DRAM technology and is not intended to describe all of the features of a DRAM. The present invention uses the basic architecture and fabrication techniques of a DRAM and provides an embedded ROM array for non-volatile storage of data. This data can be used to store boot-type data for a system, a non-volatile look-up table, or other data that does not require a dedicated ROM memory device. Embedding ROM storage in a DRAM is most economically beneficial if the DRAM is not substantially altered during fabrication or operation. That is, small fabrication changes allow the embedded memory to be fabricated using known techniques. Further, it is desired to maintain operation of the memory in a manner that is externally transparent. As such, an external processor, or system, does not need special protocol to interface with the embedded memory.

One technique for physically programming ROM embedded cells is described in U.S. Pat. No. 6,134,137 issued Oct. 17, 2000 entitled "ROM-Embedded-DRAM", incorporated herein by reference. U.S. Pat. No. 6,134,137 teaches that slight modifications in fabrication masks allow DRAM cells to be hard programmed to Vcc or Vss by shorting the cell to wordlines. The memory reads the ROM cells in a manner that is identical to reading the DRAM cells. As described below, the present invention provides an improved ROM embedded DRAM.

Figure 2:
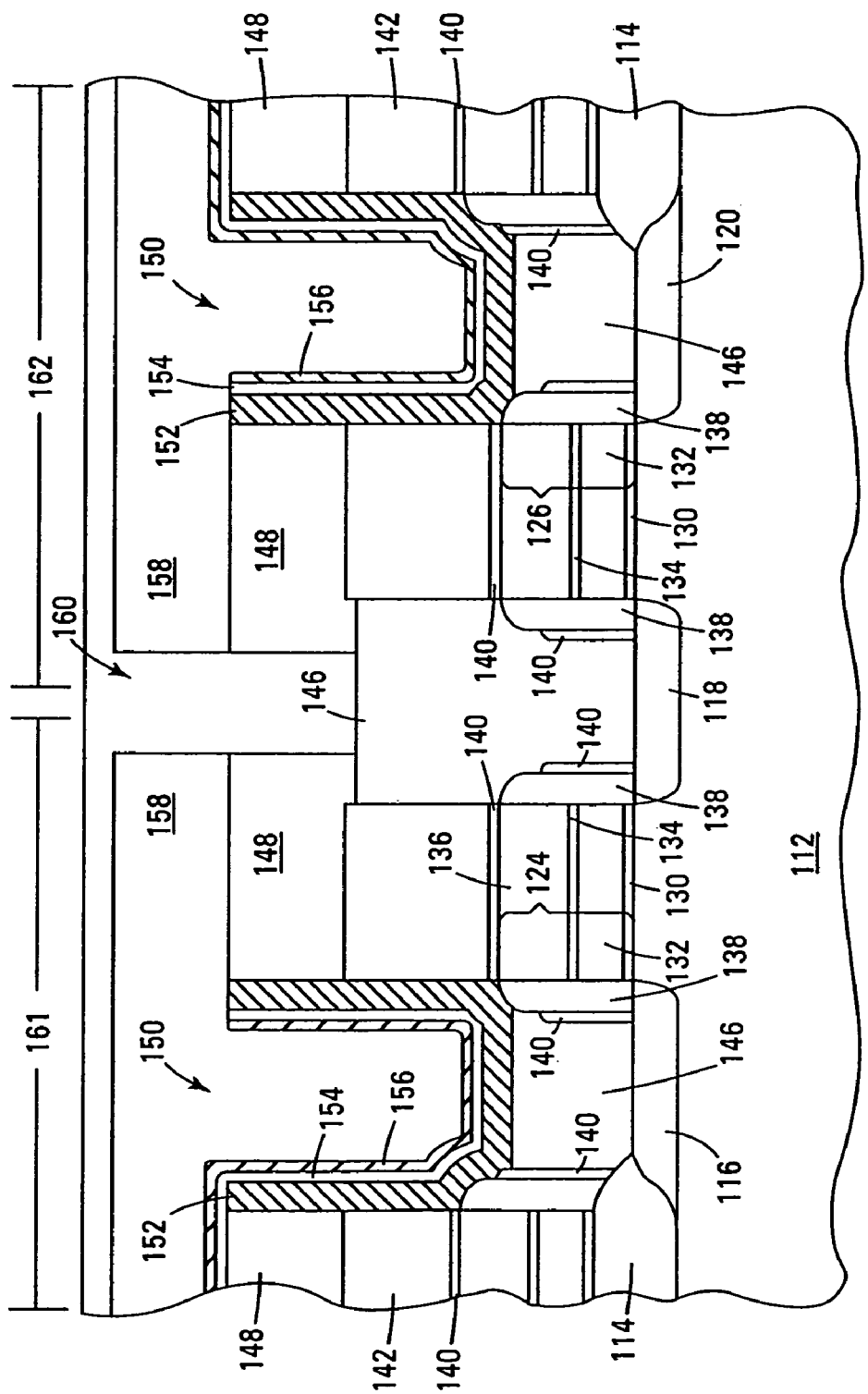
FIG. 2 illustrates a semiconductor wafer cross section of an embodiment of the present invention.

Referring to FIG. 2, a semiconductor cross section of capacitor cells 150 of an embodiment of the present invention is described. A semiconductor is comprised of a bulk silicon substrate 112 with field isolation oxide regions 114 and active areas 116, 118, 120 formed therein. Word lines 124 and 126 have been constructed in a conventional manner and include a lower gate oxide 130, a lower poly layer 132, a higher conductivity silicide layer 134 and an insulating silicon nitride cap 136. Each wordline has also been provided with insulating spacers 138, which are also composed of silicon nitride. Two FETs are depicted in FIG. 2. One FET is comprised of two active areas (source/drain) 116, 118 and one wordline (gate) 124. The second FET is comprised of two active areas (source/drain) 118, 120 and a second wordline (gate) 126. The active area 118 common to both FETs is the active area over which a bit line contact will be formed.

A thin layer 140 of nitride or TEOS (tetraethyl orthosilicate) is provided adjacent to spacers 138 and above nitride cap 136. A layer of insulating material 142 is deposited over layer 140 and cap 136. The insulating material preferably consists of borophosphosilicate glass (BPSG). Conductive plugs 146 are formed in contact with the active areas 116, 118, 120. An example of the material used to form conductive plug layer 146 is in situ arsenic or phosphorous doped poly. An additional layer 148 of BPSG is deposited on insulator 142.

Conductive storage node 152 (lower electrode) of the capacitor is provided. Node 152 may be formed of hemispherical grained poly (HSG) to increase capacitance. If HSG poly is used, the layer 152 may be formed by first depositing a layer of in situ doped polysilicon followed by a deposition of undoped HSG. Subsequent heating inherent in wafer processing will effectively conductively dope the overlying HSG layer. Alternatively, the node 152 may be provided by in situ arsenic doping of an entire HSG layer. Node 152 is in electrical contact with plugs 146 over the non-bit line active areas 116, 120. A capacitor dielectric layer 154 is provided over a second BPSG layer 148 and over the conductive node 152. The dielectric layer 154 may comprise a $Ta_2O_5$ or oxide-nitride-oxide (ONO) dielectric, although other materials are of course possible.

A second conductive node 156 is provided over the dielectric layer 154. The second conductive node 156 is preferably composed of poly. In addition to serving as a second plate of the capacitor, the second conductive node 156 also forms the interconnection lines between the second plates of capacitors. A bit line insulating layer 158 is provided over the second conductive layer 156 and the second BPSG layer 148. The bit line insulating layer 158 may be comprised of BPSG. A bit line contact 160 is provided such that the bit line contact is in electrical contact with plug 146. Thus, plug 146 over the active area 118 acts as a bit line contact to ROM cell 161 and DRAM cell 162.

The array may then be completed using processing techniques that are well known in the art, including opening holes in the overlaying insulator glass to the polysilicon periphery plugs, metalizing the holes via tungston plugs or aluminum force fill, and then patterning and etching conductive lines on the surface to form local interconnects. It will be obvious to those having ordinary skill in the art that changes and modifications may be made to the process without departing from the scope and spirit of the invention as claimed. For example, other dielectric materials such as silicon dioxide, titanium oxide, yttrium oxide, barium strontium titanate, combinations of these, and others, may be used for dielectric 154, and other insulating materials, such as the above and various other oxides, may be substituted for the BPSG of layer 142. Additionally, materials other than HSG or CHSG (e.g., cylindrical grain poly (CGP)) may be substituted for rugged polysilicon layer.

As explained above, the present invention provides a ROM embedded DRAM. The ROM cells are hard programmed by electrically shorting the DRAM cell plates using a potential sufficient to breakdown the intermediate dielectric layer. As such, the DRAM capacitor cell is not limited to the container example described in FIG. 2, but can be any known capacitor cell design. Electrical shorts are formed through the dielectric layer of the capacitor and the cell plates are coupled to a bias voltage during operation. The bias voltage can be any suitable voltage, such as Vcc or Vss. Although, the ROM cells can individually be programmed to either bias voltage (logic one or zero), it may be desired to use only one bias voltage. In this embodiment, the memory senses unprogrammed ROM cells using a reference circuit, a bias technique or a half-density array, as described below.

The memory includes programming circuitry 133 (FIG. 1) to selectively couple the ROM cells to program voltage levels to breakdown the dielectric layer between the capacitor cell plates. Anti-fuse programming circuitry is known to those skilled in the art, and can be easily adapted to function in the present invention.

Figure 3:
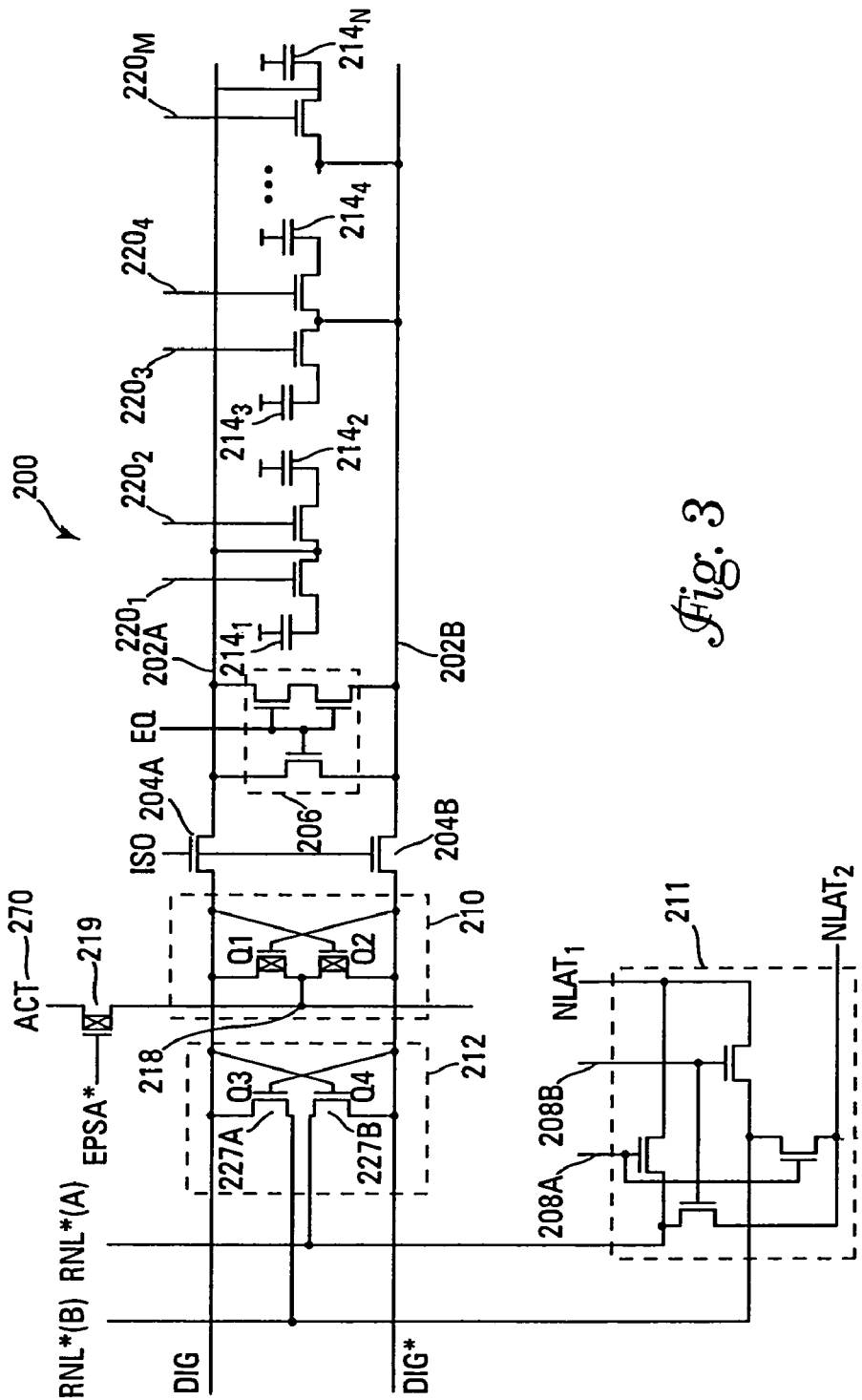
FIG. 3 illustrates a pair of complementary digit lines of the memory of FIG. 1.

FIG. 3 illustrates a pair of complementary digit lines, or bit lines 202A and 202B respectively. Specifically, FIG. 3 is a schematic diagram illustrating a detailed portion of a sense amplifier circuit and related auxiliary connection circuitry. The schematic 200 includes an illustration of devices for digit line equilibration shown collectively as 206, a p-sense amplifier 210, as well as an n-sense amplifier 212. The p-sense amplifier 210 includes a pair of cross-coupled p-channel transistors, Q1 and Q2 respectively. A first common node 218 is coupled to the pair of p-channel transistors Q1 and Q2. In one embodiment, common node 218 includes electrical coupling to an active pull-up (ACT) 270 or power voltage supply node through an enable p-sense amplifier (EPSA*) transistor 219. In one embodiment, the ACT 270 couples a Vcc voltage supply to the common node 218. In another embodiment, ACT 270 couples a different bias to common node 218.

The n-sense amplifier 212 includes a pair of cross-coupled n-channel transistors, Q3 and Q4 respectively. The n-sense amplifier 212 and the p-sense amplifier 210 are further coupled to a complementary pair of bit lines, or digit lines 202A and 202B. ROM memory cells, $214_1, \ldots, 214_N$, etc., located at the intersection of digit lines 202A and 202B and wordlines $220_1, \ldots, 220_M$. Each n-channel transistor, Q3 and Q4, of the n-sense amplifier is independently coupled at points 227A and 227B to an n-sense amplifier bus line, RNL*A and RNL*B respectively. In operation, the n-sense amplifier bus lines, RNL*A and RNL*B, couple each n-channel transistor, Q3 and Q4, to an n-sense amplifier latch signal, $NLAT_1$ and $NLAT_2$.

The coupling of the $NLAT_1$ and $NLAT_2$ to each n-channel transistor, Q3 and Q4 is controlled by series of gate transistors shown collectively as 211. In one embodiment, the gate transistors are operated by bias, 208A and 208B. The bias signals 208A and 208B are applied in the alternative. Applying bias 208A couples $NLAT_1$ to RNL*A and $NLAT_2$ to RNL*B. Applying bias 208B has the opposite resultant effect. In one embodiment, $NLAT_1$ is at a potential of Vcc/2 (or DVC2) and $NLAT_2$ is at a potential of Vcc/2+ (or DVC2+), slightly greater than DVC2. In one embodiment, DVC2+ is approximately 50 millivolts (mV) higher than the potential of DVC2. These potentials are placed on the respective n-sense amplifier bus lines, RNL*A or RNL*B depending on which bias, 208A or 208B, is selected. Thus, NLAT is at a potential of DVC2 and $NLAT_2$ is at a potential of DVC2+ when bias 208A is chosen. N-sense amplifier bus lines, RNL* is biased to DVC2 and RNL*B is biased to DVC2+. ACT 270 meanwhile is biased to Vss or signal ground. The digit lines are both initially equilibrated at Vcc/2. Thus, the n-sense amplifier transistors and p-sense amplifier transistors are off. When the memory cell is accessed, a signal develops across the complementary digit line pair. While one digit line contains charge from the cell accessed, the other digit line does not and serves as a reference for the sensing operation. Isolation transistors 204A and 204B are used to isolate the sense amplifiers when they are not needed.

In operation, the n-sense amplifier is fired by bringing, NLAT$_1$ and NLAT$_2$, toward ground. As the voltage difference between NLAT$_1$ and the reference digit line, and between NLAT$_2$ and digit line and approaches Vt, the n-channel transistor whose gate is connected to the higher voltage digit line begins to conduct. This conduction is further assisted, however, by the fact that NLAT$_1$ with the DVC2 bias pulls to ground more quickly, reaching that transistor's saturation conduction region more rapidly. Thus, even if the signal difference across the complementary digit line pair is not very clear or distinguishable, one of the n-channel transistors is biased to turn on more quickly, favoring a logical "1" read. The remainder of the sensing operation occurs as known to those skilled in the art. The conduction of the n-channel transistor causes the low-voltage digit line to be discharged toward the NLAT* voltage. Ultimately, NLAT* reaches ground, and the digit line is brought to ground potential. The p-sense amplifier is next fired and the ACT 270 is brought toward Vcc in complementary fashion to the n-sense amplifier. With the low-voltage digit line approaching ground, there is a strong signal to drive the appropriate p-channel transistor into conduction.

In an embodiment of the present invention, ROM cells 214 are programmed to one logic state, but not the other. That is, all ROM cells can be programmed to logic ones and not logic zeros. In the alternative, all ROM cells can be programmed to logic zeros and not logic ones. The sense amplifier circuitry 210/212 is biased to sense the unprogrammed ROM cells as a specific data state. In one embodiment, the sense amplifiers are biased to pull the active digit line high in the absence of a programmed "zero" memory cell. In the alternate embodiment, the sense amplifiers are biased to pull the reference digit line high in the absence of a programmed "one" memory cell on the active digit line.

The present invention is not limited to the bias circuit described above, but can be any biasing technique which allows the sense amplifier circuitry to favor one data state when the digit lines have a small, or zero, differential voltage. For example, the p-sense amplifier circuit can be biased. Further, both the p-sense and n-sense amplifier circuitry can be biased. In memory devices that use sense circuitry, which differs from the cross-couple circuit described, further biasing circuitry can be used.

The present invention allows an embedded ROM to be fabricated in a DRAM, while programming the ROM cells using only one data state. The above-described embodiment biases the sense amplifier circuitry to accurately read un-programmed memory cells. In other embodiments, digit line voltages are biased using reference memory cells to reliably sense un-programmed ROM cells, as described below.

Figure 4:
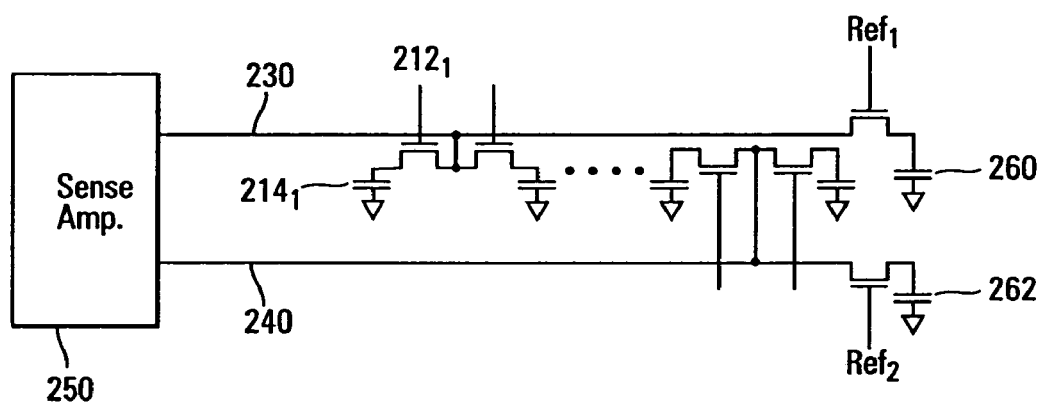
FIG. 4 illustrates a pair of complementary digit lines and reference cells of an embodiment of the memory of FIG. 1.

Referring to FIG. 4, a portion of a ROM array is described. The array includes a pair of digit lines 230 and 240 coupled to a differential voltage sense amplifier circuit 250. Each digit line can be selectively coupled to reference memory cells 260 and 262 to provide a differential between the digit lines. In one embodiment, a reference cell 260 is coupled to the active digit line 230 to bias the digit line toward the un-programmed state. In a complementary embodiment, reference cell 262 is coupled to the reference digit line 240 to bias the reference digit line toward a programmed cell state. The reference cells can be ROM cells coupled to an intermediate voltage level X, such that ½Vcc<X<Vcc, or Vss<X<½Vcc. Alternatively, the reference cells can be DRAM capacitor cells that contain an appropriate charge that moves its corresponding digit line voltage.

Figure 5:
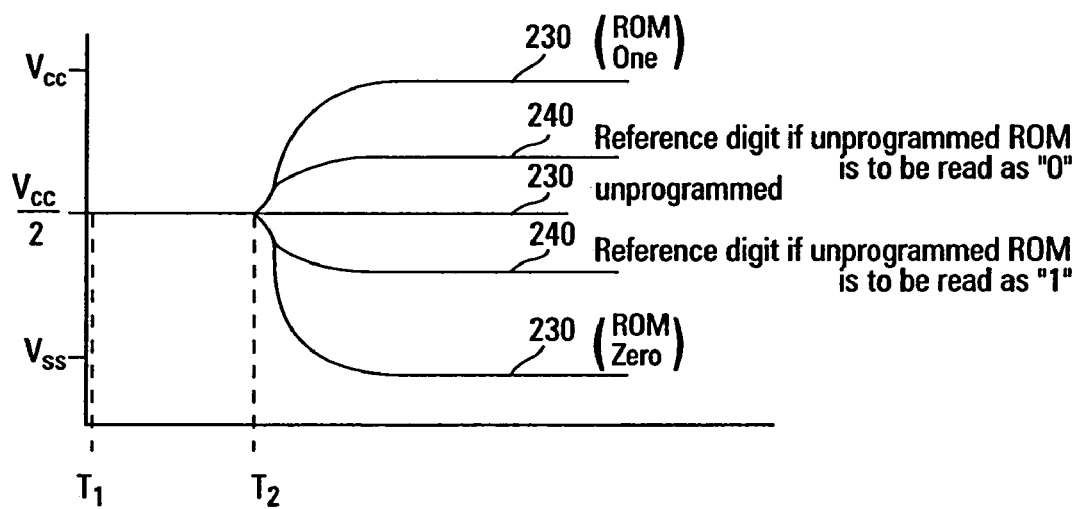
FIG. 5 is a simplified timing diagram of operation of an embodiment of the memory of FIG. 4.
Figure 6:
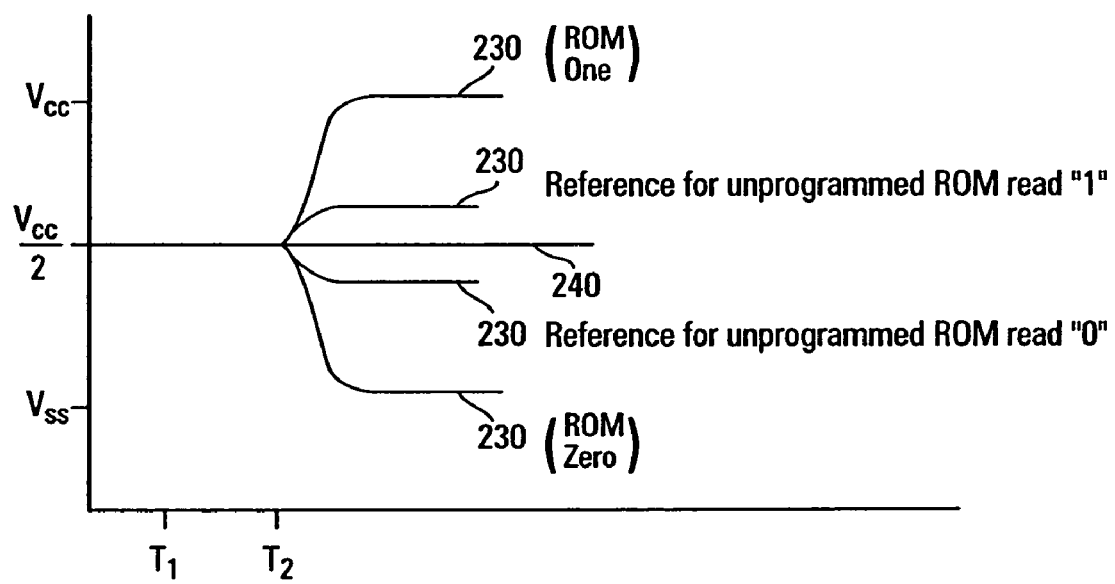
FIG. 6 is another simplified timing diagram of operation of an embodiment of the memory of FIG. 4.

As illustrated in the timing diagram of FIG. 5, at time T1 the bit lines 230 and 240 are equilibrated to ½ Vcc. At time T2, the memory cell wordline 212$_1$ is activated. At the same time, the reference wordline, Ref$_2$, is activated to couple the reference cell 262 to the reference digit line 240. If the ROM cell is un-programmed the active digit line remains substantially at ½ Vcc and the reference digit line voltage is either increased or decreased, depending on the ROM program option for the memory. If the ROM cell is programmed, the active digit line is pulled to either Vcc or Vss, depending upon the ROM program option for the memory. Alternatively, the reference cell can be coupled to the active digit line. As illustrated in the timing diagram of FIG. 6, at time T1 the bit lines are equilibrated to ½ Vcc. At time T2, the memory cell wordline 212$_1$ is activated. At the same time, the reference wordline, Ref1, is activated to couple the reference cell 260 to the active digit line 230. If the ROM cell is un-programmed the active digit line is either increased or decreased, depending on the ROM program option for the memory, and the reference digit line voltage remains substantially at ½ Vcc. If the ROM cell is programmed, the active digit line is pulled to either Vcc or Vss, depending upon the ROM program option for the memory.

Figure 7:
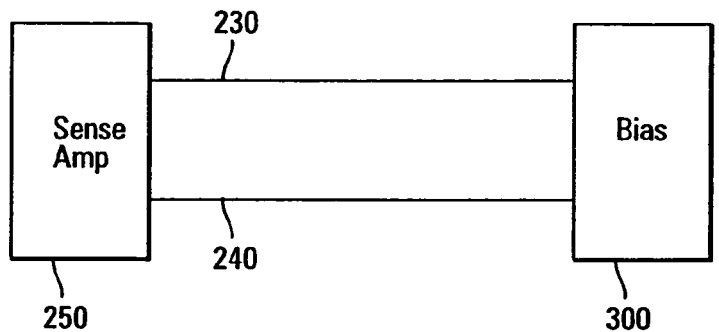
FIG. 7 illustrates a pair of complementary digit lines and bias circuitry of an embodiment of the memory of FIG. 1.
Figure 8:
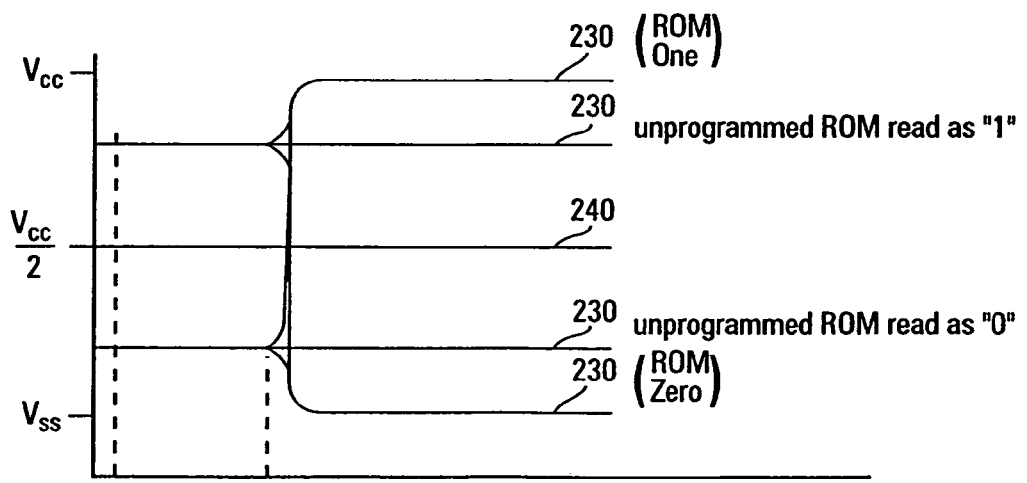
FIG. 8 is a simplified timing diagram of operation of an embodiment of the memory of FIG. 7.

FIG. 7 is a simplified illustration of a bias circuit 300 coupled to digit lines 230 and 240. The bias circuit allows the digit lines to be biased to different voltage levels prior to reading a memory cell. For example, the ROM cells can be hard programmed to a one state (as described above) and the active digit line is biased to a voltage below the reference digit line. As illustrated in the timing diagram of FIG. 8, at time T1 reference bit line 240 is biased to ½ Vcc and active bit line 230 is biased to a lower voltage (sufficient to provide a differential voltage detected by sense amplifier 250). At time T2, a memory cell wordline is activated to couple a memory cell to digit line 230. If the ROM cell is un-programmed the active digit line 230 remains below ½ Vcc and the reference digit line voltage remains at ½ Vcc. If the ROM cell is programmed, the active digit line is pulled to Vcc.

Alternatively, the ROM cell can be hard programmed to a zero state (as described above) and the active digit line is biased to a voltage above the reference digit line. As illustrated in the timing diagram of FIG. 8, at time T1 reference bit line 240 is biased to ½ Vcc and active bit line 230 is biased to a higher voltage (sufficient to provide a differential voltage detected by sense amplifier 250). At time T2, a memory cell wordline is activated to couple a memory cell to digit line 230. If the ROM cell is un-programmed the active digit line 230 remains above ½ Vcc and the reference digit line voltage remains at ½ Vcc. If the ROM cell is programmed, the active digit line is pulled to either Vss.

The above biasing techniques allow for accurate sensing of un-programmed ROM cells. Alternatively, the un-programmed memory cells can be pre-programmed and refreshed in a manner similar to standard DRAM. For example, ROM cells are programmed to Vss and un-programmed ROM cells are charged to Vcc. Initially all of the ROM memory cells are coupled to Vcc to pre-charge the cells. The programmed ROM cells are also coupled to Vcc, but remain at, or return to, Vss following pre-charge. Over a period of time, the un-programmed ROM cell loses the pre-charge and require a refresh. The refresh operation is substantially the same as the pre-charge operation. Controlling the ROM program voltage during pre-program and refresh operations can avoid contention between the programmed ROM cells and the pre-charge voltage.

If the ROM cells are hard programmed to Vcc, the memory cells are discharged to Vss to insure that the DRAM cells are at Vss. Refresh operations, however, are not required to maintain Vss. Controlling the ROM program voltage during pre-program and refresh operations can avoid contention between the programmed ROM cells and the pre-charge/refresh voltages.

Figure 9:
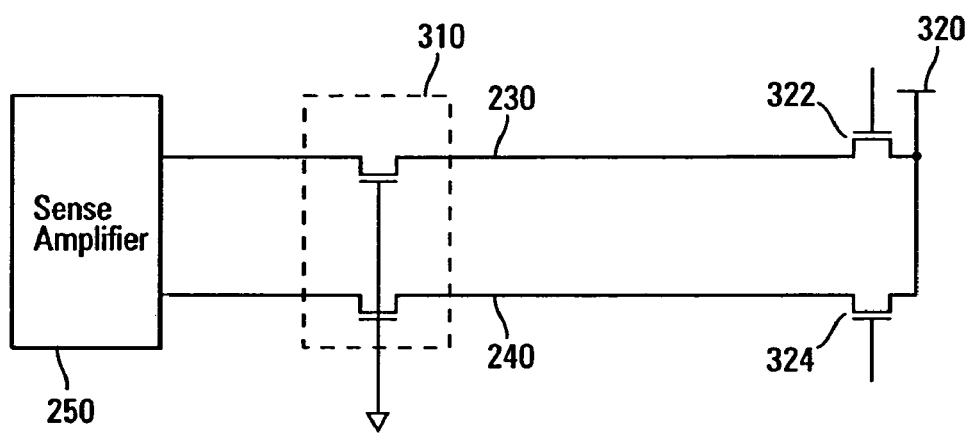
FIG. 9 illustrates a pair of complementary digit lines and with isolated sense amplifier of an embodiment of the memory of FIG. 1.

In another embodiment, the DRAM can be fabricated to provide ROM cells that are disconnected from digit line sense amplifiers. Referring to FIG. 9, isolation circuitry 310 is provided between the digit lines 230 and 240 and the sense amplifier circuitry 250. The isolation circuitry can be provided in both the ROM and DRAM arrays; however, the isolation circuitry is activated during operation of the ROM. The digit lines of the ROM are selectively coupled to a voltage bias source via switches 322 and 324. The voltage bias source is selected based upon the programmable state of the ROM cells. For example, the digit lines can be coupled to Vcc when the ROM cells are programmable to a zero state, Vss. Alternatively, the digit lines can be coupled to Vss when the ROM cells are programmable to a one state, Vcc. The switch circuitry 322 and 324 that selectively couples the digit lines to the voltage bias can be transistors. The transistors may be long-L transistors that limit the current conducted when a hard programmed ROM cell is read. During operation, the voltage bias circuit couples the active digit line to either Vcc or Vss. When the wordline is activated, a hard programmed ROM cell couples the digit line to Vss or Vcc and overpowers the bias circuitry. Thus, the bias circuitry establishes a default voltage that remains present on the digit lines when an unprogrammed ROM cell is read, but overpowered when a programmed ROM cell is read.

The present invention can use two memory cells to store a bit of data. One of the memory cells is a hard programmed ROM cell and the second cell is a DRAM capacitor cell. The ROM cell can be programmed to either a logic one or a logic zero. The second cell can be either charged or discharged. If the ROM cell is programmed to a logic one (Vcc), the DRAM cell remains uncharged. As such, the differential voltage between the two digit lines is Vcc–Vss. Prior to reading the memory cell, the digit lines can be pre-charged to an intermediate voltage, such as ½ Vcc. In this embodiment, the differential voltage is reduced, but uncertainty of the state of the DRAM cell is reduced.

If the ROM cell is programmed to a logic zero (Vss), the DRAM cell is charged to Vcc. As such, the differential voltage between the two digit lines is again Vcc–Vss. To insure that the DRAM cell has a charged state, a pre-program operation is performed on the ROM array. The pre-program operation programs all cells to Vcc, however, hard programmed ROM cells will not retain a Vcc state. That is, the programmed cells either have a hard short to Vss or a high leakage path to Vss. These cells cannot maintain a charge, but the un-programmed DRAM cells are charged. It will be appreciated that a periodic refresh operation is needed to maintain the charge on the un-programmed cells.

CONCLUSION

A ROM embedded DRAM has been described that provided ROM cells that can be electrically programmed to a data state using DRAM capacitor memory cells. Numerous techniques for reading the memory cells are provided if a single state memory is desired. For example, bias techniques have been described to read un-programmed ROM cells accurately. In one embodiment, the memory includes program circuitry to short capacitor plates together by breaking down an intermediate dielectric layer using anti-fuse programming techniques.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A processing system, comprising:
a processor; and
a memory coupled to the processor to store data provided by the processor and to provide data to the processor the memory comprising:
an array of capacitor memory cells;
access transistors coupled between each capacitor memory cell and a digit line;
sense amplifier circuitry coupled to the digit line; and
anti-fuse program circuitry coupled to selectively program the capacitor memory cells, such that conductive plates of the capacitor memory cells are permanently shorted together.

2. The processing system of claim 1 wherein the program circuitry selectively applies a potential difference across the capacitor memory cells to break-down an intermediate dielectric layer of the capacitor memory cells.

3. The processing system of claim 1 wherein the shorted capacitor memory cells are coupled to receive a program potential during memory read operations.

4. A processing system, comprising:
a processor; and
a read only memory (ROM) embedded dynamic random access memory (DRAM) coupled to the processor to store data provided by the processor and to provide data to the processor, the memory comprising:
a first DRAM memory cell array;
a second DRAM memory cell array; and
anti-fuse program circuitry coupled to selectively program the second DRAM memory cell array, such that conductive plates of a plurality of memory cells of the second DRAM array are permanently shorted together.

5. The processing system of claim 4 wherein the program circuitry selectively applies a potential difference across the plurality of memory cells to break-down an intermediate dielectric layer of plurality of memory cells.

6. The processing system of claim 5 wherein the intermediate dielectric layer comprises either $Ta_2O_5$ or oxide-nitride-oxide (ONO) dielectric.

7. The processing system of claim 4 wherein the programmed memory cells are coupled to receive a program potential during memory read operations.

8. The processing system of claim 7 wherein the program potential is either Vcc or Vss.

9. A memory comprising:
an array of capacitor memory cells;
access transistors coupled between each capacitor memory cell and a digit line;
sense amplifier circuitry coupled to the digit line; and
anti-fuse program circuitry coupled to selectively program the capacitor memory cells, such that conductive plates of the capacitor memory cells are permanently shorted together.

10. The memory of claim 9 wherein the program circuitry selectively applies a potential difference across the capacitor memory cells to break-down an intermediate dielectric layer of the capacitor memory cells.

11. The memory of claim 10 wherein the shorted capacitor memory cells are coupled to receive a program potential during memory read operations.

12. A method of programming a read only memory (ROM) comprising:
providing a program potential; and
using anti-fuse techniques to selectively electrically short first memory cell capacitors using the program potential, such that the first memory cell capacitors form a non-volatile conductive path.

13. The method of claim 12 further comprising coupling the first memory cells to abias voltage.

14. The method of claim 13 wherein the bias voltage is Vcc.

15. The method of claim 12 further comprising:
coupling the first memory cells to Vcc; and
discharging second memory cell capacitors.

16. The method of claim 12 further comprising:
coupling the first memory cells to Vss; and
charging second memory cell capacitors to Vcc.

17. A method of providing a read only memory (ROM) embedded dynamic random access memory (DRAM) comprising:
fabricating a ROM array comprising memory capacitor cells;
applying a program voltage to a first plurality of the memory capacitor cells to break down a dielectric layer to selectively short the first plurality of the memory capacitor cells using anti-fuse programming techniques;
coupling the first plurality of the memory cells to a first voltage; and
charging a second plurality of the memory capacitor cells to a second voltage.

18. The method of claim 17 wherein the first and second voltage are Vcc and Vss, respectively.

19. The method of claim 17 wherein the first and second voltage are Vss and Vcc, respectively.

20. The method of claim 17 wherein the dielectric layer comprises either $Ta_2O_4$ or oxide-nitride-oxide (ONO) dielectric.

21. A method of operating a read only memory (ROM) embedded dynamic random access memory (DRAM) memory system, comprising:
providing a program potential to the memory; and
using anti-fuse techniques to selectively electrically short first memory cell capacitors using the program potential, such that the first memory cell capacitors form a non-volatile conductive path.

22. The method of claim 21 further comprising coupling the first memory cells to a bias voltage.

23. The method of claim 21 wherein the bias voltage is Vcc.

24. The method of claim 21 further comprising:
coupling the first memory cells to Vcc; and
discharging second memory cell capacitors.

25. The method of claim 21 further comprising:
coupling the first memory cells to Vss; and
charging second memory cell capacitors to Vcc.

* * * * *

UNITED STATES PATENT AND TRADEMARK OFFICE
CERTIFICATE OF CORRECTION

| | |
|---|---|
| PATENT NO. | : 7,218,547 B2 |
| APPLICATION NO. | : 10/843161 |
| DATED | : May 15, 2007 |
| INVENTOR(S) | : Casey Kurth, Scott Derner and Phillip G. Wald |

It is certified that error appears in the above-identified patent and that said Letters Patent is hereby corrected as shown below:

Column 8, line 16, replace "Refl," with --$Ref_1$,--.
Column 10, line 16, replace "processor." with --processor,--.
Column 11, line 14, replace "to abias voltage" with --to a bias voltage--.
Column 12, line 10, replace "either Ta2O4 or" with --either $Ta_2O_5$ or--.
Column 12, line 22, replace "claim 21 wherein the" with --claim 22 wherein the--.

Signed and Sealed this

Eighteenth Day of March, 2008

JON W. DUDAS
*Director of the United States Patent and Trademark Office*